(12) United States Patent
Liu

(10) Patent No.: US 11,978,653 B2
(45) Date of Patent: *May 7, 2024

(54) SYSTEMS AND METHODS FOR WAFER POD ALIGNMENT

(71) Applicant: Taiwan Semiconductor Manufacturing Co., Ltd., Hsinchu (TW)

(72) Inventor: Chao-Hsiang Liu, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/883,572

(22) Filed: Aug. 8, 2022

(65) Prior Publication Data

US 2022/0384232 A1   Dec. 1, 2022

Related U.S. Application Data

(60) Continuation of application No. 16/989,251, filed on Aug. 10, 2020, now Pat. No. 11,469,128, which is a
(Continued)

(51) Int. Cl.
*H01L 21/68* (2006.01)
*B25J 11/00* (2006.01)
(Continued)

(52) U.S. Cl.
CPC ........ *H01L 21/68* (2013.01); *H01L 21/67265* (2013.01); *H01L 21/681* (2013.01);
(Continued)

(58) Field of Classification Search
CPC ...... B25J 9/1664; B25J 9/1666; B25J 9/1684; B25J 9/1692; B25J 11/0095; B25J 19/022;
(Continued)

(56) References Cited

U.S. PATENT DOCUMENTS 4,595,331 A    6/1986   Thompson
4,906,159 A    3/1990   Sabo
(Continued)

FOREIGN PATENT DOCUMENTS

EP    2555031 A1 *  2/2013   ........... G02B 6/4221
JP    H02218146 A     8/1990
KR    100786365 B1   12/2007

OTHER PUBLICATIONS

Official Action dated Dec. 25, 2018, in corresponding Taiwan Patent Application No. 10721207730.

*Primary Examiner* — James Keenan
(74) *Attorney, Agent, or Firm* — Duane Morris LLP

(57) ABSTRACT

In an embodiment, a wafer pod includes: a cavity configured to receive and store a wafer; an alignment fiducial within the cavity, wherein: the alignment fiducial comprises two lines orthogonal to each other, and the alignment fiducial is configured to be detected by a robotic arm alignment sensor disposed on a robotic arm, wherein the alignment fiducial defines an alignment orientation for a robotic arm gripper hand to enter into the cavity.

20 Claims, 8 Drawing Sheets

Related U.S. Application Data division of application No. 15/883,509, filed on Jan. 30, 2018, now Pat. No. 10,741,433.

(60) Provisional application No. 62/592,068, filed on Nov. 29, 2017.

(51) Int. Cl.
*H01L 21/67* (2006.01)
*B25J 9/16* (2006.01)
*H01L 21/673* (2006.01)

(52) U.S. Cl.
CPC ............ *B25J 9/1664* (2013.01); *B25J 9/1692* (2013.01); *B25J 11/0095* (2013.01); *H01L 21/67386* (2013.01); *Y10S 414/137* (2013.01)

(58) Field of Classification Search
CPC ......... H01L 21/67265; H01L 21/67386; H01L 21/67778; H01L 21/68; H01L 21/681; Y10S 414/137; Y10S 901/03; Y10S 901/09; Y10S 901/45; Y10S 901/47
See application file for complete search history.

(56) References Cited

U.S. PATENT DOCUMENTS

| | | |
|---|---|---|
| 4,950,118 A | 8/1990 | Mueller |
| 5,044,752 A | 9/1991 | Thurfjell |
| 5,801,506 A | 9/1998 | Netzler |
| 6,298,280 B1 | 10/2001 | Bonora |
| 6,323,616 B1 | 11/2001 | Sagues et al. |
| 6,532,403 B2 | 3/2003 | Beckhart |
| 6,763,281 B2 | 7/2004 | Schauer |
| 6,944,517 B2 | 9/2005 | Krupyschev |
| 6,950,721 B2 | 9/2005 | Tashiro |
| 7,206,663 B2 | 4/2007 | Teng |
| 7,456,977 B2 | 11/2008 | Ramsey |
| 7,572,092 B2 | 8/2009 | Hofmeister |
| 8,210,791 B2 | 7/2012 | Chilson |
| 8,634,633 B2 | 1/2014 | Kiley |
| 8,744,624 B1 | 6/2014 | Kaveh |
| 9,352,466 B2 | 5/2016 | Liao |
| 10,541,162 B2 | 1/2020 | Liu |
| 2002/0026259 A1 | 2/2002 | Hirata |
| 2016/0133502 A1 | 5/2016 | Won |

\* cited by examiner

SYSTEMS AND METHODS FOR WAFER POD ALIGNMENT

CROSS-REFERENCE TO RELATED APPLICATION

This application is a continuation of U.S. patent application Ser. No. 16/989,251, filed Aug. 10, 2020, now U.S. Pat. No. 11,469,128, which is a divisional application of U.S. patent application Ser. No. 15/883,509 filed Jan. 30, 2018, now U.S. Pat. No. 10,741,433, which claims priority to U.S. Provisional Patent Application No. 62/592,068, filed on Nov. 29, 2017, each of which are incorporated by reference herein in their entireties.

BACKGROUND

Modern assembly line manufacturing processes are typically highly automated to manipulate materials and devices and create a finished product. Quality control and maintenance processes often rely on human skill, knowledge and expertise for inspection of the manufactured product and manufacturing process.

Typical assembly line processes for processing wafers (e.g., semiconductor devices or materials) employ no specific inspection techniques at a robotic arm for alignment with a wafer carrying pod, also termed as a wafer pod, aside from manual inspections. Examples of wafer pods include standard mechanical interface (SMIF) pods which may hold a plurality of wafers, or front opening unified pods (FOUPs) which may hold larger wafers.

Alignment is important as a robotic arm that is not aligned with a wafer pod may place or retrieve wafers from the wafer pod in a manner that damages the wafer. For example, a non-aligned robotic arm may damage a wafer by impacting the wafer carried by the non-aligned robotic arm against a side, front, or rear wall of the wafer pod. However, conventional manual inspection and alignment techniques require large amounts of overhead and expensive hardware, but still fail to produce satisfactory results. Therefore, conventional inspection techniques are not entirely satisfactory.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of discussion.

DETAILED DESCRIPTION OF EXEMPLARY EMBODIMENTS

Figure 1A:
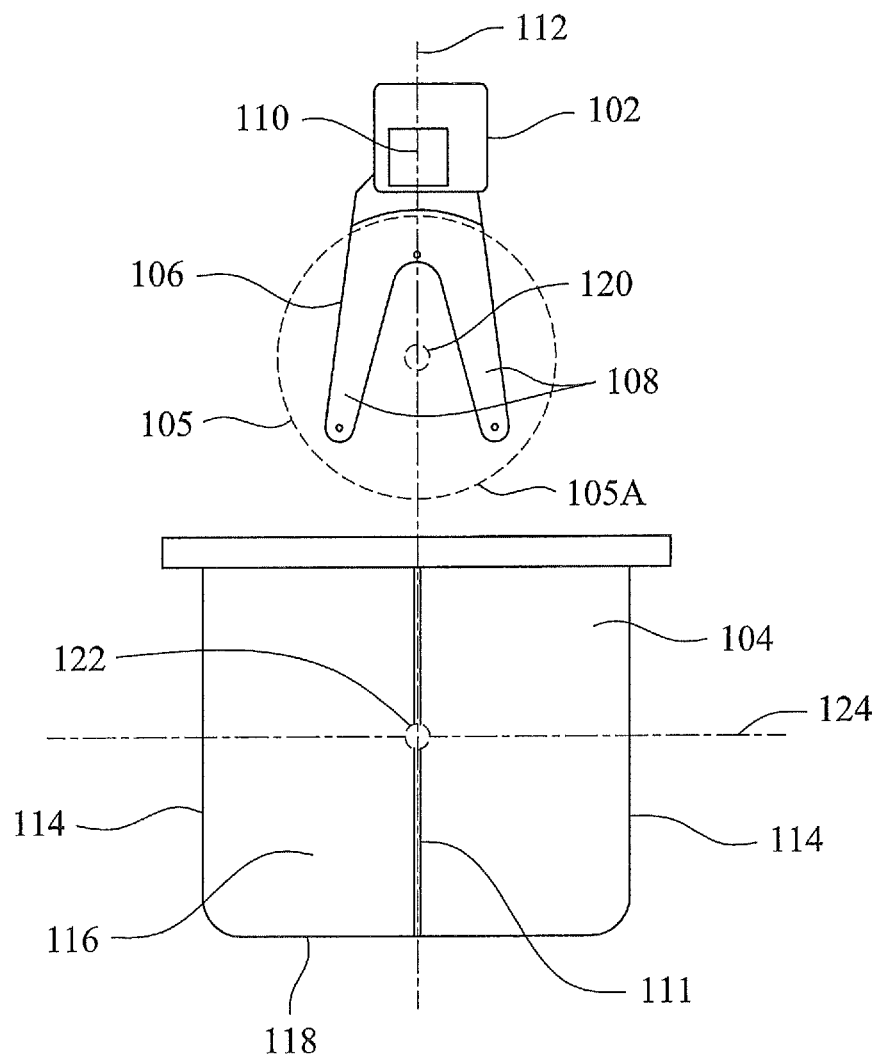
FIG. 1A is a top cross sectional view of a robotic arm disposed relative to a wafer pod, in accordance with some embodiments.

The following disclosure describes various exemplary embodiments for implementing different features of the subject matter. Specific examples of components and arrangements are described below to simplify the present disclosure. These are, of course, merely examples and are not intended to be limiting. For example, it will be understood that when an element is referred to as being "connected to" or "coupled to" another element, it may be directly connected to or coupled to the other element, or one or more intervening elements may be present.

In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides various embodiments of automated wafer pod alignment with a robotic arm gripper hand. A robotic arm gripper hand may be automatically aligned for entry within a cavity of a wafer pod. The cavity may be any opening within a wafer pod configured to receive and hold a wafer. This automatic alignment may utilize sensors on both or either the robotic arm (that includes the robotic arm gripper hand) and the wafer pod. For example, the robotic arm may include an alignment sensor to determine an alignment orientation of the robotic arm gripper hand to a fiducial within the cavity of the wafer pod. Positioning the gripper hand in the alignment orientation may ensure that the robotic arm may enter into the cavity of the wafer pod with a wafer that is clear of any side walls of the wafer pod (e.g., that the robotic arm entry is centered). Also, the robotic arm gripper hand may utilize a center point sensor within the wafer pod to determine how far extended the robotic arm gripper hand should extend into the cavity of the wafer pod without causing a wafer to impact a rear or front walls (e.g., a door) of the wafer pod. In contrast, conventional alignment for robotic arm gripper hand entry into a wafer pod is performed manually and not in an automated manner.

FIG. 1A is a top cross sectional view 100 of a robotic arm 102 disposed relative to a wafer pod 104, in accordance with some embodiments. The robotic arm 102 may include a gripper hand 106 configured to grip and manipulate a wafer 105. The wafer 105 is illustrated in phantom with a dotted line outline. The gripper hand 106 may include a number of fingers 108 which are configured to extend under and support a wafer on top of the fingers 108. The fingers may include a gripper surface that makes physical contact with a wafer in order to secure, manipulate, and move the wafer. The top cross sectional view 100 may include a top cross sectional view of the wafer pod 104 and a top view of the robotic arm 102.

The robotic arm 102 may include an alignment sensor 110. The alignment sensor 110 may be configured to sense alignment with a fiducial 111 located along a surface of the cavity of the wafer pod 104. The alignment may be along an axis of entry 112 which defines a straight path into the wafer pod 104 in a manner that allows the wafer 105 to not impact a sidewall 114 during entry into the cavity. As will be discussed in greater detail below, the alignment fiducial 111 may be a line along the axis of entry 112 and along a floor 116 within a cavity of the wafer pod 104. Although the alignment fiducial may be discussed as along a floor 116, in other embodiments the alignment fiducial 111 may be along a ceiling instead of a floor or, in yet other embodiments, along both a ceiling and a floor of the cavity of the wafer pod 104.

The alignment fiducial 111 may be a straight line fiducial to along the axis of entry 112. As will be discussed further below and although not illustrated in FIG. 1A, the alignment fiducial 111 may also be along the rear wall 118 of the cavity of the wafer pod 104. Stated another way, the alignment fiducial 111 may be a vertical straight line fiducial along a rear wall 118 of the cavity and also longitudinal line along the floor 116 of the cavity. Accordingly, when aligned with the alignment fiducial 111, the gripper hand 106 may be controlled to move in a manner restrained along two degrees of freedom.

In particular embodiments, the alignment sensor 110 may include a laser emitter that emits a laser which is sensed in reflection by a laser sensor collocated with the laser emitter. In other embodiments, the laser emitted by the laser emitter may be sensed directly by an alignment fiducial sensor along the alignment fiducial 111. In such embodiments, the alignment sensor on the robotic arm may communicate with the alignment fiducial sensor and only include a laser emitter without a laser sensor, or may include both a laser emitter and a laser sensor. The laser emitter may include a photoelectric emitter that emits collimated radiation (e.g., light) as a line or beam that terminates in a point. The laser sensor maybe configured to sense collimated radiation. For example, the laser sensor may be an image sensor configured to determine when the collimated radiation of the laser emitter aligns with the alignment fiducial along both the floor 116 and the back wall 118. When the laser emitter emits radiation as a point (e.g., along a beam terminating in a point), the laser emitter may be mounted on a sensor platform and moved in a controlled manner along a single degree of freedom so as to have a terminus of the collimated radiation traverse the length of the alignment fiducial 111. In such an embodiment, the robotic arm 102 may move (e.g., rotate) the platform along a degree of freedom so that the point radiation of the laser emitter may traverse (e.g., confirm alignment) with the alignment fiducial 111 along both the floor 116 and the back wall 118. When the laser emitter emits radiation as a line, the laser sensor may confirm that the emitted line is aligned with the alignment fiducial 111 along both the floor 116 and the back wall 118. The alignment fiducial 111 will be discussed further below at least in connection with FIG. 2A.

In various embodiments, the wafer 105 may be a dummy wafer 105A. The dummy wafer 105A may be used for initial alignment and subsequently replaced with non-dummy wafers to be transported in the wafer pod 104. The dummy wafer 105A may include a center point fiducial 120. Also, the wafer pod 104 may include a center point sensor 122. The center point sensor 122 may be configured to detect when the center point fiducial 120 is at a center point of the wafer pod 104. Stated another way, the center point sensor 122 may be configured to sense when the center point fiducial 120 of a dummy wafer 105A is at a central vertical axis of the cavity of the wafer pod. The central vertical axis may be at a point along both the axis of entry 112 and a side axis 124 but orthogonal to both the axis of entry 112 and the side axis 124. An amount of entry into the wafer pod 104 before the center point sensor 122 detects the center point fiducial 120 may be recorded as a displacement depth. This displacement depth may be stored (e.g., recorded in a data store for future retrieval) so that the amount of entry may be repeated for subsequent entry of the robotic arm gripper hand into the cavity of the wafer pod 104.

Figure 1B:
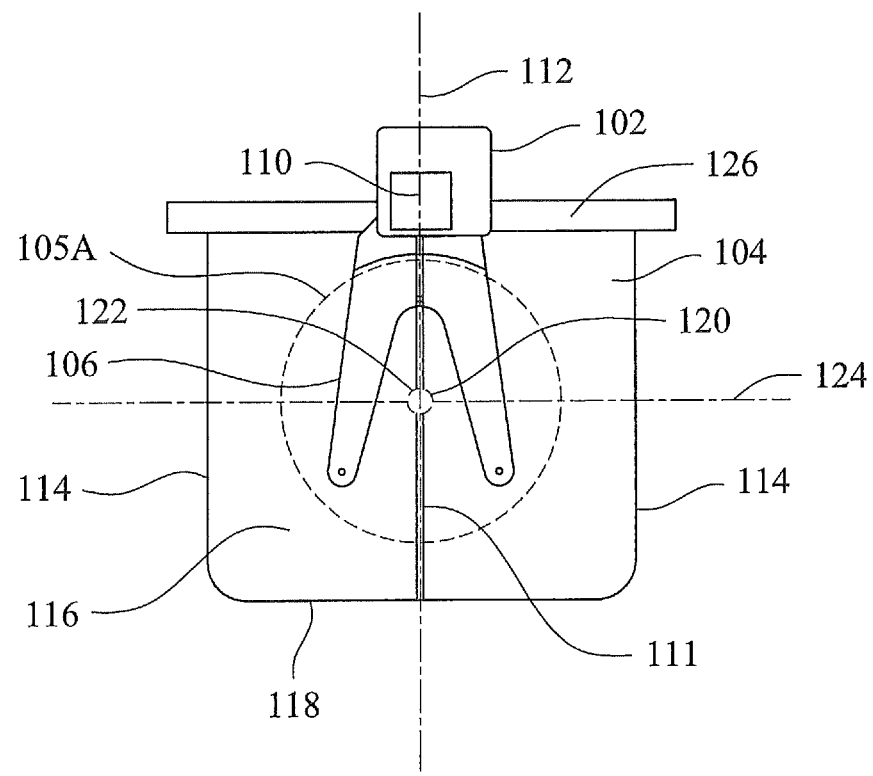
FIG. 1B is a top cross sectional view of a dummy wafer deployed within a wafer pod, in accordance with some embodiments.

FIG. 1B is a top cross sectional view 125 of the dummy wafer 105A deployed within the wafer pod 104, in accordance with some embodiments. When deployed, the dummy wafer 105A may be transported by the gripper hand 106 into the wafer pod 104 so that the center point fiducial 120 of the dummy wafer 105A may be detected by the center point sensor 122. The center point sensor 122 may be configured to sense along the central vertical axis (e.g., above or below the center point sensor 122) at a center point of the wafer pod 104 where a wafer is to be centered at. Accordingly, the gripper hand 106 transport the dummy wafer 105A into the wafer pod 104 along the axis of entry 112 by using the alignment sensor 110 to ensure alignment with a fiducial along the axis of entry 112. Also, the gripper hand may stop entry of the dummy wafer 105A into the cavity of the wafer pod 104 when the center point sensor 122 detects the center point fiducial 120 of the dummy wafer 105A. The amount of displacement (e.g., displacement depth value) of the gripper hand 106 into the cavity of the wafer pod 104 at the point of detection of the center point fiducial 120 by the center point sensor 122 may be termed as a displacement depth. The displacement depth may be recorded and utilized to determine an amount of displacement utilized in subsequent handling of wafers so that the gripper hand 106 does not extend too close or too far into the cavity of the wafer pod 104 to cause the wafer, held by the gripper hand 106, to impact the rear wall 118 of the wafer pod 104 and/or a door 126 or front wall of the wafer pod 104.

Figure 2A:
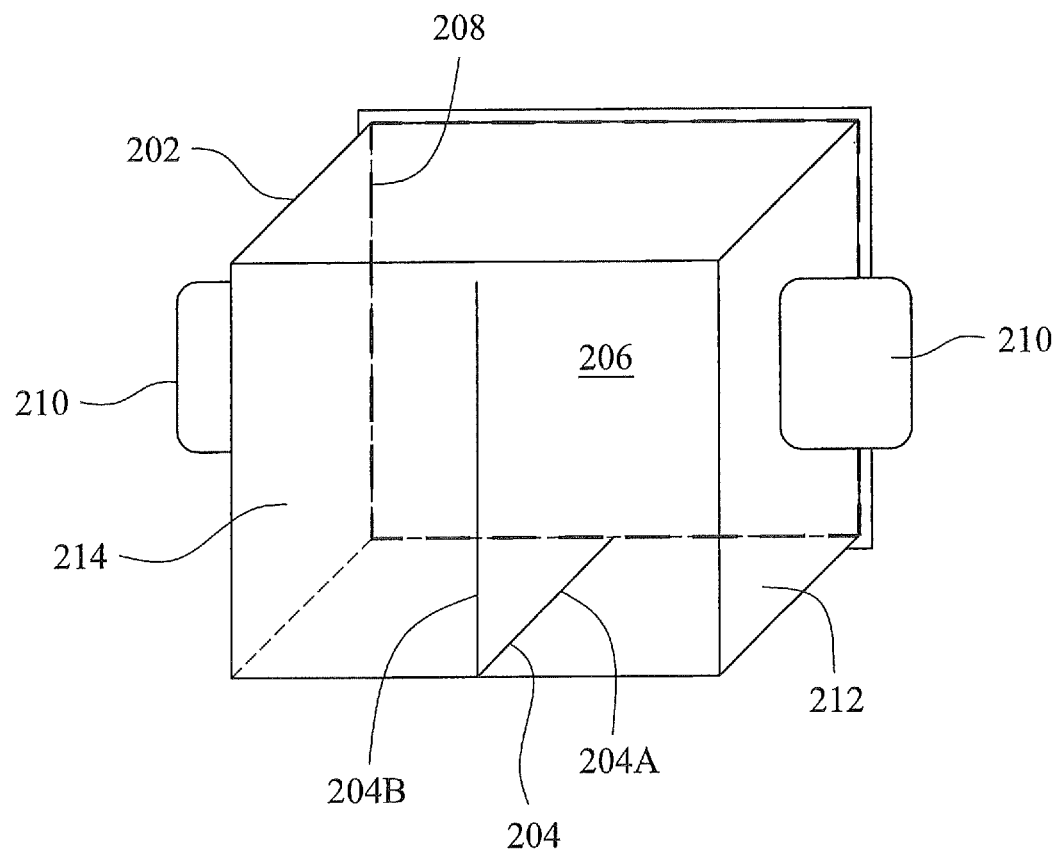
FIG. 2A is a partial transparency diagram of a wafer pod with an alignment fiducial, in accordance with some embodiments.

FIG. 2A is a partial transparency diagram of a wafer pod 202 with an alignment fiducial 204, in accordance with some embodiments. The wafer pod 202 may be hollow, with a cavity 206 and a door 208, drawn in phantom with dotted lines, to allow for ingress and egress from the cavity 206 of the wafer pod 202. The sides of the wafer pod 202 may include exterior grips 210 or handles to facilitate movement of the wafer pod 202. The wafer pod 202 is illustrated as a partial transparency diagram 200 in which features of the cavity 206 may be illustrated for ease of explanation.

The alignment fiducial 204 may include a first portion 204A along a floor 212 of the wafer pod 202 and a second portion 204B along a rear wall 214 of the wafer pod 202. The rear wall 214 may be opposite to the door 208. The door 208 may also be referred to as a front wall. As discussed above, the first portion 204A may extend along an axis of entry. Also, the second portion 204B may extend along a vertical axis (e.g., along a same direction as a central vertical axis discussed above). Accordingly, when a gripper hand is aligned with the alignment fiducial 204 along both the first portion 204A and the second portion 204B, the gripper hand may have its movement constrained around both the vertical axis and the axis of entry.

In various embodiments, a wafer pod may include multiple cavities for multiple wafers. The multiple cavities may be arrayed (e.g., displaced) along the vertical axis, such as where additional cavities may be reproduced above and/or below the cavity 206 (e.g., below the floor 212, where the floor 212 acts as a ceiling for another cavity of a multiple cavity wafer pod.

Figure 2B:
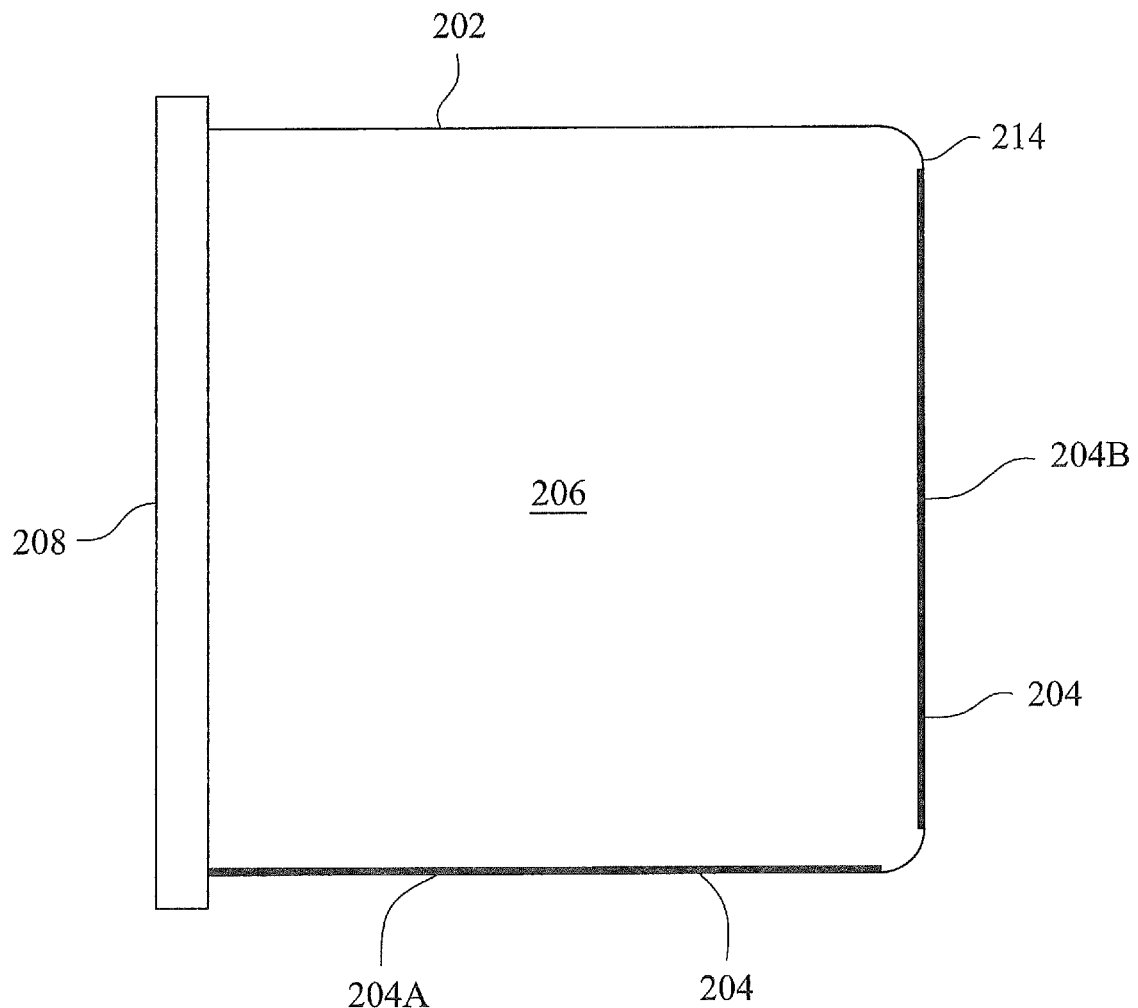
FIG. 2B is a side cross sectional view of a wafer pod with an alignment fiducial, in accordance with some embodiments.

FIG. 2B is a side cross sectional view of the wafer pod 202 with the alignment fiducial 204, in accordance with some embodiments. The first portion 204A of the alignment fiducial 204 may be along the floor 212 of the cavity 206 while the second portion 204B of the alignment fiducial 204 may be along the rear wall 214 of the cavity 206. Also, the first portion 204A and the second portion 204B of the alignment fiducial 204 may not be continuous (e.g., connected). However, the first portion 204A and the second portion 204B of the alignment fiducial 204 may be continuous in other embodiments.

Figure 3:
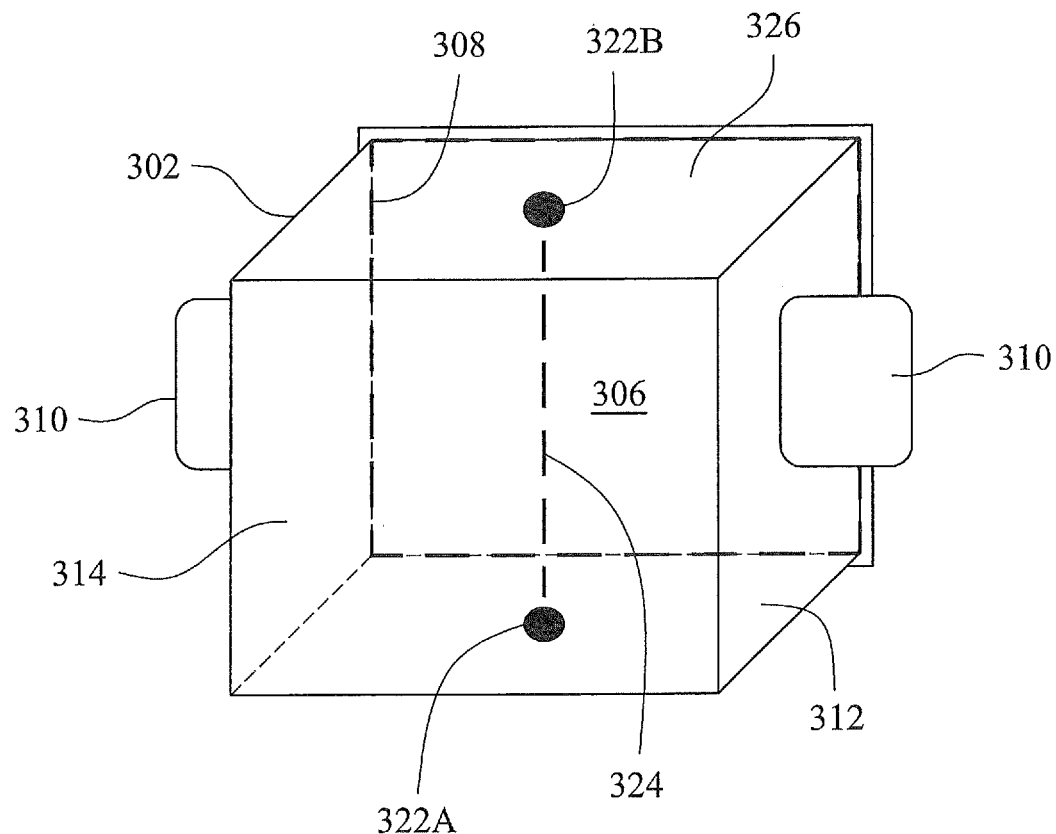
FIG. 3 is a partial transparency diagram of a wafer pod with a center point sensor, in accordance with some embodiments.

FIG. 3 is a partial transparency diagram of a wafer pod 302, in accordance with some embodiments. Similar to FIG. 2A, the wafer pod 302 of FIG. 3A may be hollow, with a cavity 306 and a door 308, drawn in phantom with dotted lines, to allow for ingress and egress from the cavity 306 of the wafer pod 302. The sides of the wafer pod 302 may include exterior grips 310 or handles to facilitate movement of the wafer pod 302. The wafer pod 302 is illustrated as a partial transparency diagram 300 in which features of the cavity 306 may be illustrated for ease of explanation.

The wafer pod 302 may include a center point sensor 322A or 322B. As discussed above, the center point sensor 322A or 322B may be configured to detect when a center point fiducial of a dummy wafer is along a central vertical axis 324 between a center point of a floor 312 and a ceiling 326 of the wafer pod 302. Stated another way, the center point sensor 322A or 322B may be configured to sense when the center point fiducial 120 of a dummy wafer 105A is aligned with a central vertical axis 324 within the cavity of the wafer pod 302.

The center point sensor may be disposed along either the floor 312 or the ceiling 326 of the wafer pod 104. For example, the center point sensor 322 may emit radiation in a collimated beam from either the floor 312 to terminate at the ceiling 326 or from the ceiling 326 to terminate at the floor 312. The center point sensor may be configured to sense when the beam, emanating from the floor 312 or the ceiling 326 is reflected from the center point fiducial of a dummy wafer. For example the center point sensor 322A or 322B may include a laser emitter that emits a laser. This laser may be sensed in reflection by a laser sensor collocated with the laser emitter at the center point sensor 322A or 322B. The center fiducial may produce a unique property in the reflection, such as a reflection with a particular intensity or certain wavelengths. The laser emitter may include a photoelectric emitter that emits collimated radiation as a line or beam to terminate at a point. Also, the laser sensor may include a photoelectric sensor configured to detect particular types of the collimated radiation as reflected off of the center point fiducial of a dummy wafer.

Figure 4:
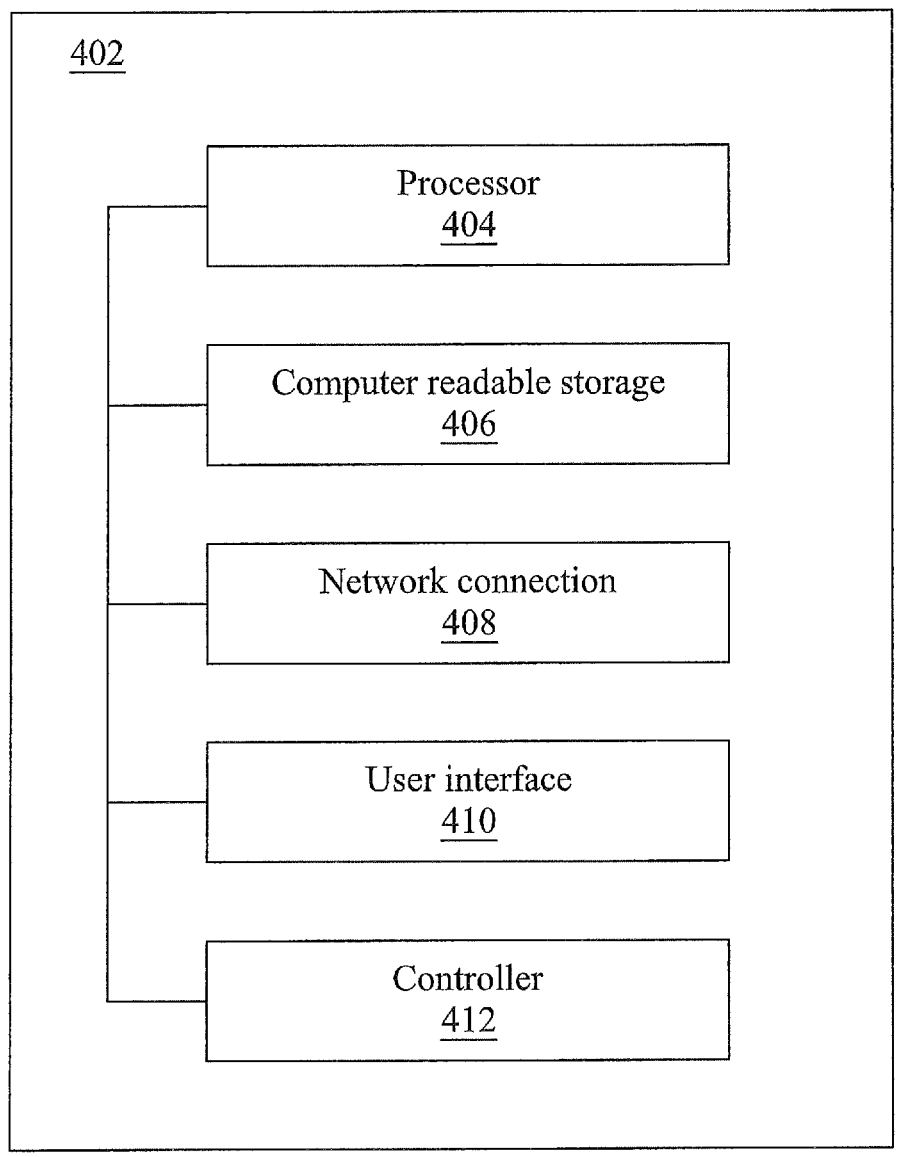
FIG. 4 is a block diagram of various functional modules of a wafer pod alignment functional module, in accordance with some embodiment.

FIG. 4 is a block diagram of various functional modules of a wafer pod alignment functional module, in accordance with some embodiment. The wafer pod alignment functional module 402 may be part of a wafer pod alignment system that includes the robotic arm and the wafer pod discussed above. The wafer pod alignment functional module 402 may include a processor 404. In further embodiments, the processor 404 may be implemented as one or more processors.

The processor 404 may be operatively connected to a computer readable storage module 406 (e.g., a memory and/or data store), a network connection module 408, a user interface module 410, and a controller module 412. In some embodiments, the computer readable storage module 406 may include wafer pod alignment process logic that may configure the processor 404 to perform the various processes discussed herein. The computer readable storage may also store data, such as sensor data collected by sensors, data for identifying an displacement depth, identifiers for a dummy wafer, identifiers for a robotic arm, identifiers for a gripper hand, identifiers for a sensor, and any other parameter or information that may be utilized to perform the various processes discussed herein.

The network connection module 408 may facilitate a network connection of the wafer pod alignment system with various devices and/or components of the wafer pod alignment system that may communicate within or external to the wafer pod alignment functional module 402. In certain embodiments, the network connection module 408 may facilitate a physical connection, such as a line or a bus. In other embodiments, the network connection module 408 may facilitate a wireless connection, such as over a wireless local area network (WLAN) by using a transmitter, receiver, and/or transceiver. For example, the network connection module 408 may facilitate a wireless or wired connection with an alignment sensor, center point sensor, the processor 404 and the controller module 412.

The wafer pod alignment functional module 402 may also include the user interface module 410. The user interface may include any type of interface for input and/or output to an operator of the wafer pod alignment system, including, but not limited to, a monitor, a laptop computer, a tablet, or a mobile device, etc.

The wafer pod alignment functional module 402 may include a controller module 412. The controller module 412 may be configured to control various physical apparatuses that control movement or functionality of the robotic arm and/or components of the robotic arm. For example, the controller module 412 may be configured to control movement or functionality for at least one of a gripper hand, a gripper hand surface, an alignment sensor, a center point sensor, and/or a wafer pod door. For example, the controller module 412 may control a motor that may move at least one of a gripper hand, a sensor, a sensor platform, and/or a door of a wafer pod. The controller may be controlled by the processor and may carry out the various aspects of the various processes discussed herein.

Figure 5:
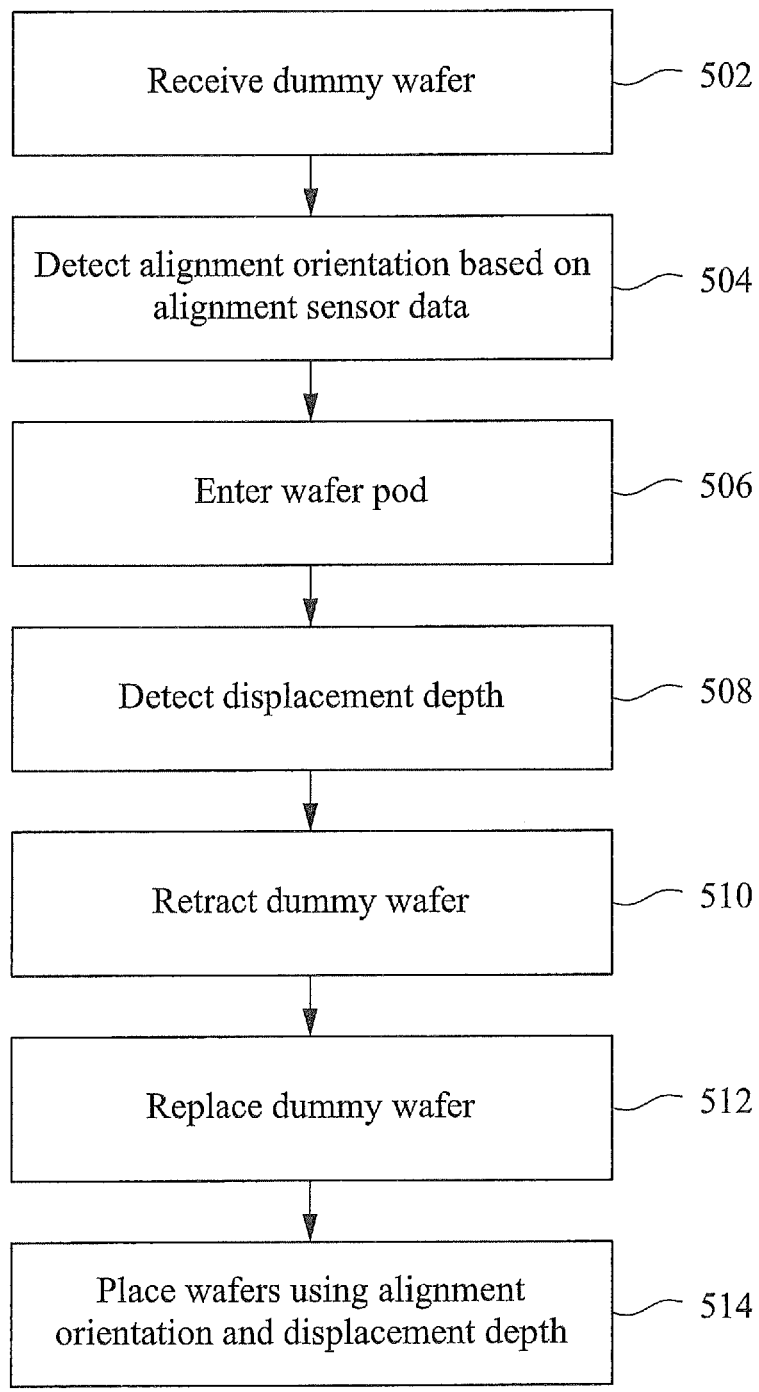
FIG. 5 is a flow chart of a wafer pod alignment placement process, in accordance with some embodiments.

FIG. 5 is a flow chart of a wafer pod alignment entry process 500, in accordance with some embodiments. The wafer pod alignment entry process may be performed by a wafer pod alignment system, as discussed above. It is noted that the process 500 is merely an example, and is not intended to limit the present disclosure. Accordingly, it is understood that additional operations may be provided before, during, and after the process 500 of FIG. 5, certain operations may be omitted, certain operations may be performed concurrently with other operations, and that some other operations may only be briefly described herein.

At operation 502, a robotic arm gripper hand (e.g., gripper hand of a robotic arm) of the wafer pod alignment system may receive a dummy wafer. As discussed above, the dummy wafer may include a center point fiducial which may be detectible by a center point sensor which confirms when the dummy wafer is at a desired location within a cavity of a wafer pod. The desired location may be at any desired location within the wafer pod, not necessarily at the very center of the wafer pod. For example, the desired location may be closer to the rear wall of the wafer pod than the door (e.g., the front wall) of the wafer pod.

At operation 504, a wafer pod alignment system may detect an alignment orientation based on alignment sensor data (e.g., data produced to determine the alignment orientation, or as produced by the alignment sensor). As introduced above, alignment orientation may be an orientation of the robotic arm gripper hand that is aligned with an alignment fiducial that defines the robotic arm gripper hand's orientation relative to an axis of entry and a vertical axis of the wafer pod. Stated another way, the alignment orientation may restrict movement of the robotic arm gripper hand along two degrees of freedom (e.g., around an axis of entry and a vertical axis) so that a wafer manipulated by the wafer hand may move into and/or out of a wafer pod without undesirably impacting a side wall of the wafer pod. The alignment orientation may be saved for future reference. For example, the alignment orientation may be used when not transporting a dummy wafer, but when moving a gripper hand (e.g., a robotic arm gripper hand) for deposit or retrieval of a wafer from the wafer pod.

At operation 506, the robotic arm gripper hand may enter the wafer pod, as oriented with the alignment orientation. As discussed above, moving with the alignment orientation allows the robotic arm gripper hand to move in a manner into and out of the wafer pod so as to allow a wafer held by the robotic arm gripper hand to enter or exit the wafer pod without impacting a sidewall of the wafer pad.

At operation 508, the robotic arm gripper hand may detect a displacement depth into the wafer pod. As introduced above, the dummy wafer may include a center point fiducial that may be detected by a center point sensor of the wafer pod. When oriented with the alignment orientation, the dummy wafer may travel along the axis of entry and move the center point fiducial of the dummy wafer toward the center point sensor. The wafer pod alignment system may confirm that the dummy wafer is in the desired location when the center point sensor detects the center point fiducial. In certain embodiments, this may be because the center point sensor detects whether the center point fiducial has reached a central vertical axis of the wafer pod. The displacement depth may characterize (e.g., indicate) a displacement of the robotic arm gripper hand from a rest position (e.g., outside of the wafer pod from where the robotic arm gripper hand may receive a wafer or begin interacting with the wafer pod) to an extend position (e.g., from where the center point detector detects the center point fiducial). The displacement depth may be saved for future reference (e.g., for use when not transporting a dummy wafer, but when transporting a wafer for deposit or retrieval from the wafer pod).

At operation 510, the robotic arm gripper hand may retract the dummy wafer. The dummy wafer may be retracted by moving in the alignment orientation along the axis of entry out of the cavity of the wafer pod. This may be a reverse movement from the movement made by the robotic arm gripper hand in operation 506, when the robotic arm gripper hand entered the wafer pod. This reverse position may terminate at a rest position for which the robotic arm gripper hand may be reoriented for other action apart from interacting with the wafer pod, or at a position for receiving or removal of a wafer from the robotic arm gripper hand.

At operation 512, the dummy wafer previously secured by the robotic arm gripper hand may be replaced by a wafer that is to be stored within the wafer pod. The wafer that is to be stored within the wafer pod may be a wafer of similar dimensions to the dummy wafer, and thus may be manipulated in a same way as the dummy wafer was manipulated in previously operations (e.g., moved by the robotic arm gripper hand in the alignment orientation).

At operation 514, the wafer may be placed within the wafer pod by the robotic arm gripper hand in accordance with the alignment orientation determined in operation 504 and in accordance with the displacement depth determined in operation 514. For example, the wafer may be moved with a same type of motion that moved the dummy wafer in operation 506. Specifically, the robotic arm gripper hand may be moved in the alignment orientation so that the wafer may enter the wafer pod without impacting (e.g., avoiding) a side wall of the wafer pod. Also, the wafer may be displaced into the wafer pod at the displacement depth so that the wafer pod is at a desired depth within the wafer pod without being too close to the rear wall of a wafer pod (e.g., without impacting the rear wall of the wafer pod) and without being too close to a door or front wall of a wafer pod (e.g., so that the wafer does not hinder the door of the wafer pod from closing). In certain embodiments, the alignment orientation may be determined with each entry of a wafer to a wafer pod, rather than saving the alignment orientation for use with subsequent wafers (e.g., in subsequent movement of the robotic arm gripper hand).

In various embodiments, the movement of wafers may be termed as a robotic arm routine which may be performed in various iterations to place multiple wafers into a wafer pod. For example, as discussed above, a wafer pod may include multiple cavities in which wafers may be stored within the wafer pod. After determining the alignment orientation and the displacement depth for one of the cavities, a corresponding alignment orientation and displacement depth may be inferred for the other cavities, but with a corresponding displacement along an axis, such as along a vertical axis for each respective cavity. Accordingly, the robotic arm gripper hand may perform multiple iterations of the robotic arm routine to transfer multiple wafers between different cavities at different times, where each wafer may be transferred in a same manner but with different cavities at different vertical displacements.

Figure 6:
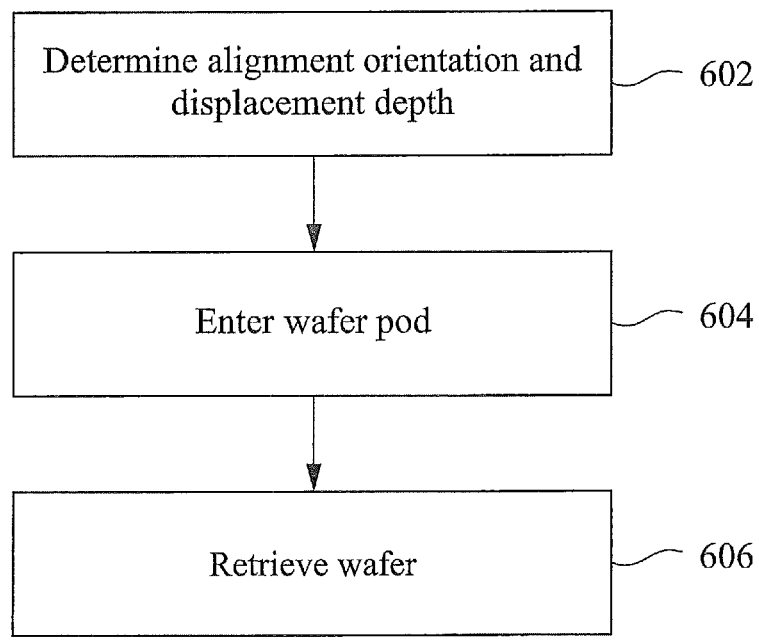
FIG. 6 is a flow chart of a wafer pod alignment retrieval process, in accordance with some embodiments.

FIG. 6 is a flow chart of a wafer pod alignment exit process 600, in accordance with some embodiments. The wafer pod alignment exit process 600 may be performed by a wafer pod alignment system, as discussed above. It is noted that the process 600 is merely an example, and is not intended to limit the present disclosure. Accordingly, it is understood that additional operations may be provided before, during, and after the process 600 of FIG. 6, certain operations may be omitted, certain operations may be performed concurrently with other operations, and that some other operations may only be briefly described herein.

At operation 602, the wafer pod alignment system may determine an alignment orientation and displacement depth for a wafer pod. The determination of the alignment orientation and displacement depth may be retrieved from a data store, such as a computer readable storage as discussed above. The original determination of the alignment orientation and displacement depth stored in the database may be determined as discussed in FIG. 5 and will not be repeated here for brevity.

At operation 604, the robotic arm gripper hand may enter the wafer pod, as oriented with the alignment orientation. As discussed above, moving with the alignment orientation allows the robotic arm gripper hand to move in a manner into and out of the wafer pod so as to allow a wafer held by the robotic arm gripper hand to enter or exit the wafer pod without impacting a sidewall of the wafer pad.

At operation 606, the robotic arm gripper hand may retrieve the wafer within the wafer pod. The gripper hand may retrieve a wafer based on an assumption that the wafer had been placed within the wafer pod at the displacement depth determined in operation 602. The gripper hand may retrieve the wafer by securing the wafer as known in the art. For example, the gripper hand may retrieve the wafer by sliding under a wafer and raising the wafer above a floor on which the wafer rested while within the wafer pod. In other embodiments the gripper hand may also grip onto the wafer to secure the wafer within the gripper hand. The gripper hand may also retrieve the wafer by retracting the robotic arm gripper hand, with the secured wafer, out of the wafer pod. For example, the wafer may be retracted by moving along the axis of entry out of the cavity of the wafer pod. This may be a reverse movement from the movement made by the robotic arm gripper hand in operation 604, when the robotic arm gripper hand entered the wafer pod.

In an embodiment, a wafer pod includes: a cavity configured to receive and store a wafer; an alignment fiducial within the cavity, wherein: the alignment fiducial comprises two lines orthogonal to each other, and the alignment fiducial is configured to be detected by a robotic arm alignment sensor disposed on a robotic arm, wherein the alignment fiducial defines an alignment orientation for a robotic arm gripper hand to enter into the cavity.

In another embodiment, a system includes: a gripper hand configured to secure a wafer; a robotic arm comprising an alignment sensor configured to detect alignment of the gripper hand to an alignment fiducial within a cavity of a wafer pod, wherein the robotic arm is configured to: determine an alignment orientation for the gripper hand to move into the cavity based on the alignment, and move the gripper hand in the alignment orientation into the cavity.

In another embodiment, a method includes: collecting alignment sensor data that characterizes alignment of a gripper hand with an alignment fiducial within a cavity of a wafer pod; determining an alignment orientation for the gripper hand for entry into the cavity based on the alignment sensor data; and moving the gripper hand in the alignment orientation into the cavity.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

In this document, the term "module" as used herein, refers to software, firmware, hardware, and any combination of these elements for performing the associated functions described herein. Additionally, for purpose of discussion, the various modules are described as discrete modules; however, as would be apparent to one of ordinary skill in the art, two or more modules may be combined to form a single module that performs the associated functions according to embodiments of the invention.

A person of ordinary skill in the art would further appreciate that any of the various illustrative logical blocks, modules, processors, means, circuits, methods and functions described in connection with the aspects disclosed herein can be implemented by electronic hardware (e.g., a digital implementation, an analog implementation, or a combination of the two), firmware, various forms of program or design code incorporating instructions (which can be referred to herein, for convenience, as "software" or a "software module"), or any combination of these techniques. To clearly illustrate this interchangeability of hardware, firmware and software, various illustrative components, blocks, modules, circuits, and steps have been described above generally in terms of their functionality. Whether such functionality is implemented as hardware, firmware or software, or a combination of these techniques, depends upon the particular application and design constraints imposed on the overall system. Skilled artisans can implement the described functionality in various ways for each particular application, but such implementation decisions do not cause a departure from the scope of the present disclosure.

Furthermore, a person of ordinary skill in the art would understand that various illustrative logical blocks, modules, devices, components and circuits described herein can be implemented within or performed by an integrated circuit (IC) that can include a general purpose processor, a digital signal processor (DSP), an application specific integrated circuit (ASIC), a field programmable gate array (FPGA) or other programmable logic device, or any combination thereof. The logical blocks, modules, and circuits can further include antennas and/or transceivers to communicate with various components within the network or within the device. A general purpose processor can be a microprocessor, but in the alternative, the processor can be any conventional processor, controller, or state machine. A processor can also be implemented as a combination of computing devices, e.g., a combination of a DSP and a microprocessor, a plurality of microprocessors, one or more microprocessors in conjunction with a DSP core, or any other suitable configuration to perform the functions described herein.

Conditional language such as, among others, "can," "could," "might" or "may," unless specifically stated otherwise, are otherwise understood within the context as used in general to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without user input or prompting, whether these features, elements and/or steps are included or are to be performed in any particular embodiment.

Additionally, persons of skill in the art would be enabled to configure functional entities to perform the operations described herein after reading the present disclosure. The term "configured" as used herein with respect to a specified operation or function refers to a system, device, component, circuit, structure, machine, etc. that is physically or virtually constructed, programmed and/or arranged to perform the specified operation or function.

Disjunctive language such as the phrase "at least one of X, Y, or Z," unless specifically stated otherwise, is otherwise understood with the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

It should be emphasized that many variations and modifications may be made to the above-described embodiments, the elements of which are to be understood as being among other acceptable examples. All such modifications and variations are intended to be included herein within the scope of this disclosure and protected by the following claims.

What is claimed is:

1. A method, comprising:
   collecting alignment sensor data that characterizes alignment of a gripper hand with an alignment fiducial within a cavity of a wafer pod, wherein the alignment fiducial comprises a first line extending along a vertical axis of a rear wall of the cavity and a second line extending along a horizontal axis of a ceiling or floor of the cavity;
   determining an alignment orientation for the gripper hand for entry into the cavity based on the alignment sensor data, wherein the alignment sensor data is collected by an alignment sensor disposed on a robotic arm configured to move the gripper hand; and
   moving the gripper hand in the alignment orientation into the cavity.

2. The method of claim 1, wherein the moving the gripper hand in the alignment orientation into the cavity avoids contact between a side wall of the wafer pod with a wafer held by the gripper hand.

3. The method of claim 1, further comprising:
   moving the gripper hand in the alignment orientation into the cavity until a center point fiducial on a dummy wafer is detected by a center point sensor in the wafer pod, wherein the dummy wafer is held by the gripper hand while moving the gripper hand; and
   receiving a displacement depth indicating a distance between a first position of the gripper hand before moving the gripper hand and a second position of the gripper hand when the center point fiducial is detected.

4. The method of claim 3, wherein the dummy wafer does not contact the rear wall of the cavity and does not contact a door of the wafer pod while moving the gripper hand, and wherein the first line extends along a central vertical axis of the rear wall of the cavity and the second line extends along a central horizontal axis of the ceiling or the floor of the cavity.

5. The method of claim 1, wherein the alignment sensor is a laser sensor.

6. The method of claim 1, wherein the alignment sensor data is collected while the gripper hand is outside of the cavity.

7. A method, comprising:
   storing a wafer in a cavity of a container;
   providing an alignment fiducial within the cavity; and
   detecting the alignment fiducial by a robotic arm alignment sensor disposed on a robotic arm configured to retrieve the wafer from the container, wherein the alignment fiducial defines an alignment orientation for a robotic arm gripper hand to enter into the cavity, wherein the alignment fiducial comprises a first line extending along a vertical axis of a rear wall of the cavity and a second line extending along a horizontal axis of a ceiling or floor of the cavity.

8. The method of claim 7, further comprising moving the robotic arm gripper hand in the alignment orientation into the cavity, wherein the moving avoids contact between a side wall of the container and a dummy wafer held by the robotic arm gripper hand.

9. The method of claim 7, further comprising:
   detecting when a center point fiducial of a dummy wafer positioned within the cavity is above or below a center point sensor provided within the cavity, and
   wherein the first line extends along a central vertical axis of the rear wall of the cavity and the second line extends along a central horizontal axis of the ceiling or the floor of the cavity.

10. The method of claim 9, wherein the center point sensor is a laser sensor.

11. The method of claim 10, wherein the laser sensor comprises a laser emitter configured to emit a laser beam between a floor and a ceiling of the cavity.

12. The method of claim 7, wherein the alignment fiducial is configured to be detected from outside the container.

13. A method, comprising:
    securing a wafer contained within a cavity of a wafer pod with a gripper hand of a robotic arm;
    detecting an alignment of the gripper hand to an alignment fiducial within the cavity of the wafer pod, wherein detecting the alignment comprises determining a displacement depth indicating a displacement value of the gripper hand when a center point fiducial of a dummy wafer held by the gripper hand is detected by a center point sensor located on the wafer pod, wherein the alignment fiducial comprises a first line extending along a vertical axis of a rear wall of the cavity and a second line extending along a horizontal axis of a ceiling or floor of the cavity; and
    moving the gripper hand based on the detected alignment within the cavity.

14. The method of claim 13, wherein the moving avoids contact between a side wall of the cavity and a dummy wafer held by the gripper hand.

15. The method of claim 14, wherein the dummy wafer does not contact the rear wall of the cavity and does not contact a door of the wafer pod while moving the gripper hand, and wherein the first line extends along a central vertical axis of the rear wall of the cavity and the second line extends along a central horizontal axis of the ceiling or the floor of the cavity.

16. The method of claim 13, wherein detecting the alignment comprises detecting an alignment of a laser line, emitted from an alignment sensor, with the alignment fiducial.

17. The method of claim 13, further comprising detecting when the center point fiducial located on the dummy wafer held by the gripper hand is positioned within the cavity above or below the center point sensor located within the cavity.

18. The method of claim 17, wherein the center point sensor is a laser sensor.

19. The method of claim 18, wherein the laser sensor comprises a laser emitter configured to emit a laser beam between a floor and a ceiling of the cavity.

20. The method of claim 19, wherein the laser emitter comprises a photoelectric emitter.

* * * * *